(12) United States Patent
Patel et al.

(10) Patent No.: US 7,193,410 B2
(45) Date of Patent: Mar. 20, 2007

(54) TRANSISTOR MONITOR FOR A MULTIPHASE CIRCUIT

(75) Inventors: Raoji A. Patel, Framingham, MA (US); Robert A. Guenther, Pepperell, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/838,755

(22) Filed: May 4, 2004

(65) Prior Publication Data

US 2005/0248360 A1 Nov. 10, 2005

(51) Int. Cl.
*G01R 31/26* (2006.01)
*G05F 1/00* (2006.01)

(52) U.S. Cl. .................... 324/158.1; 324/769

(58) Field of Classification Search ............... 324/769, 324/158.1; 327/53, 538, 543, 436, 437; 361/85, 361/76, 101, 18
See application file for complete search history.

(56) References Cited

U.S. PATENT DOCUMENTS

| | | | |
|---|---|---|---|
| 5,252,864 A * | 10/1993 | Kooijman | 327/350 |
| 5,726,997 A * | 3/1998 | Teene | 714/726 |
| 5,828,308 A * | 10/1998 | Fukami | 340/664 |
| 5,844,326 A * | 12/1998 | Proctor et al. | 307/34 |
| 6,100,676 A * | 8/2000 | Burstein et al. | 323/283 |
| 6,278,283 B1 * | 8/2001 | Tsugai | 324/678 |
| 6,366,069 B1 * | 4/2002 | Nguyen et al. | 323/282 |
| 6,545,928 B1 * | 4/2003 | Bell | 365/225.7 |
| 6,559,684 B2 * | 5/2003 | Goodfellow et al. | 327/53 |
| 6,628,106 B1 * | 9/2003 | Batarseh et al. | 323/222 |
| 6,642,738 B2 * | 11/2003 | Elbanhawy | 324/769 |
| 6,674,274 B2 * | 1/2004 | Hobrecht et al. | 323/285 |
| 6,888,469 B2 * | 5/2005 | Seferian | 340/640 |

\* cited by examiner

*Primary Examiner*—Paresh Patel

(57) ABSTRACT

A monitor system and method are described for sensing voltage changes in a plurality of transistors of a multiphase circuit comprising a sensor connected to each one of the plurality of transistors for measuring a voltage drop across the each one, a difference detector for comparing the voltage drop to a previous voltage drop attributable to the each one of the plurality of transistors, and a driver circuit for controlling a state of the plurality of transistors, wherein the driver circuit deactivates one or more of the plurality of transistors when the voltage drop varies from the previous voltage drop by a predefined amount.

16 Claims, 3 Drawing Sheets

TRANSISTOR MONITOR FOR A MULTIPHASE CIRCUIT

BACKGROUND

Source converters generally provide power to a load in one form after having converted that power from a different form. For example, an alternating current (AC) to direct current (DC) source converter will take input from an AC source and convert that input into a DC source. Additionally, voltage regulators may take input from a source with a certain voltage level (e.g., 5 Volts) and convert that input into another voltage level (e.g., 3.5 Volts) that is compatible with the load specifications.

These types of circuits are generally coupled to the load through some sort of isolation electronics or circuit, such as a transistor. This isolation helps reduce the chance that the incorrect form of the input would be applied to the load, if the conversion circuit were to ever fail. However, in some conversion architectures even the typical isolation means may not work properly depending on what part of the conversion circuit may fail.

SUMMARY

Representative embodiments of the present invention are related to a monitor for sensing voltage changes in a plurality of transistors of a multiphase circuit comprising a sensor connected to each one of the plurality of transistors for measuring a voltage drop across the each one, a difference detector for comparing the voltage drop to a previous voltage drop attributable to the each one of the plurality of transistors, and a driver circuit for controlling a state of the plurality of transistors, wherein the driver circuit deactivates one or more of the plurality of transistors when the voltage drop varies from the previous voltage drop by a predefined amount.

Additional representative embodiments of the present invention are related to a method for monitoring performance of a plurality of transistors in a multiphase circuit comprising measuring a voltage across the plurality of transistors, comparing the measured voltage against a prior measurement of the voltage, and deactivating one or more of the plurality of transistors when the measured voltage exceeds the prior measurement by a predetermined amount.

Further representative embodiments of the present invention are related to a system for preventing catastrophic failure in a multiphase circuit comprising a sensor for determining a series resistance of a plurality of transistors, a resistance monitor for comparing the series resistance to a threshold resistance value, and a switch for deactivating ones of the plurality of transistors when the series resistance exceeds the threshold resistance value.

Further representative embodiments of the present invention are related to a system for monitoring a status of a plurality of transistors in a multiphase circuit comprising means for evaluating a voltage drop across the plurality of transistors, means for comparing the measured voltage drop against a previously evaluated voltage drop, and means for turning off one or more of the plurality of transistors when the measured voltage drop varies from the previously evaluated voltage drop by predefined value.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
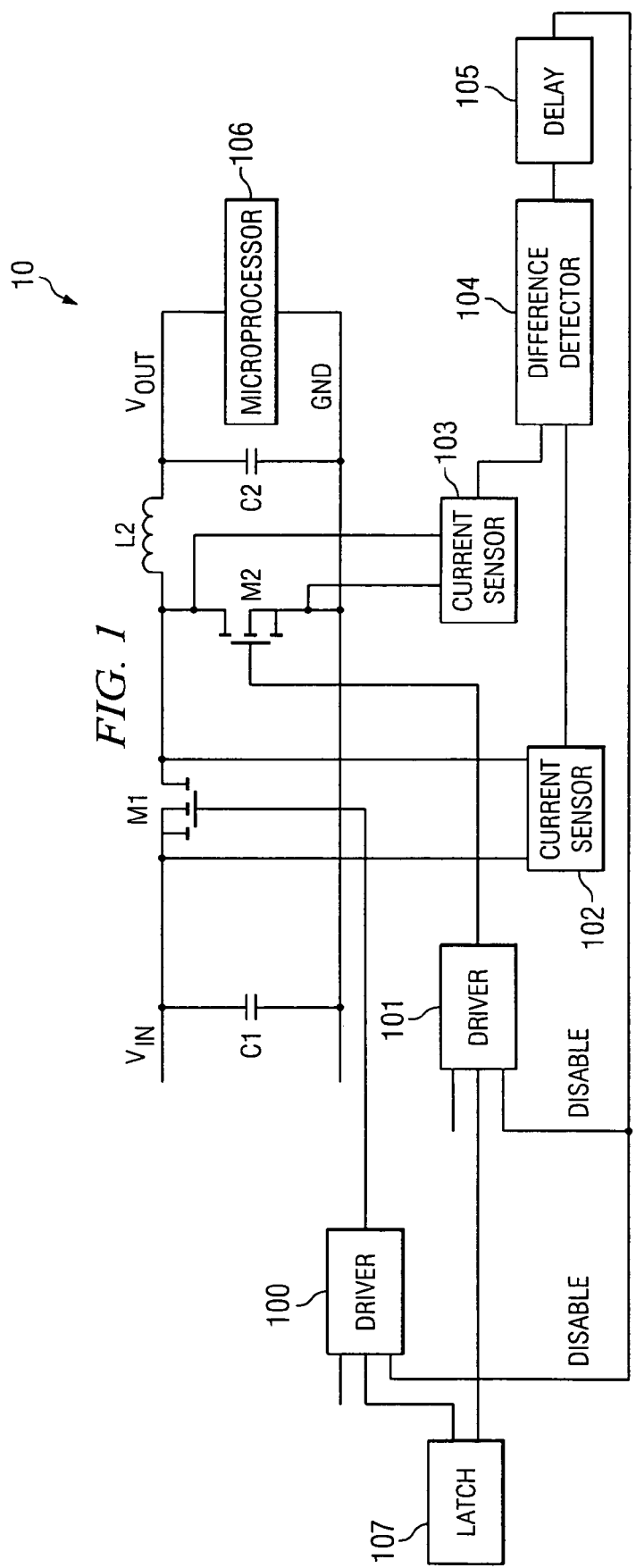
FIG. 1 is a block diagram illustrating a single phase section of a multiphase voltage regulator module (VRM) configured according to an embodiment of the transistor monitor described herein.

FIG. 1 is a block diagram illustrating single phase section 10 of a multiphase voltage regulator module (VRM) configured according to an embodiment of the transistor monitor described herein. Single phase section 10 is made up of input capacitor, C1, MOSFETs, M1 and M2, inductor, L2, and output capacitor, C2. M1 is driven by gate driver 100, and M2 is driven by gate driver 101. Single phase section 10 is shown in FIG. 1 providing power to load microprocessor 106. In operation, when M1 is on, M2 is off. The current passing through M1 from the input charges L2, which provides the output load current. As M1 turns off, M2 turns on providing a current path for L2. The energy stored in L2 from the M1 charging period now supplies the output load current.

As a MOSFET begins to fail over time, changes in the thermal resistance of the die attach or ion contamination may cause a degradation in performance and increase the series resistance between the drain and the source nodes ($r_{DS}$). The increase in $r_{DS}$ will usually increase the power dissipation of the MOSFET, which typically causes a further increase in the junction temperature. Once the junction temperature reaches a certain level, catastrophic failure generally occurs in the MOSFET. Single phase section 10 includes current sensors 102 and 103 across M1 and M2. By monitoring the current flowing through M1 and M2, changes in $r_{Ds}$ of that device may be quickly discovered. Detected changes in $r_{Ds}$ allow the system to shut down M1 and M2 before catastrophic failure.

In operation, the peak currents that flow in M1 and M2 are normally equal during the switching period due to the inductive load of L2. Therefore, current sensors 102 and 103 monitor the voltage drops across M1 and M2. Current sensors 102 and 103 may be configured as a sample and hold circuit which would be used to continuously compare the measured voltage drops in difference detector 104. Transient signals from load microprocessor 106 may interfere with the comparison by difference detector 104. Therefore, delay module 105 allows for the transients from load microprocessor 106 to reduce or eliminate the effect on the comparison. If difference detector 104 detects an unacceptable deviation between the monitored voltage drops, M1 and/or M2 will be disabled and latched off by various means such as deactivating gate drivers 100 and 101. Because single phase section 10 is part of a multiphase converter, the remaining phases would continue to properly operate even with single phase section 10 latched off.

It should be noted that in additional embodiments of the transistor monitor described herein, latch 107 may be added to ensure that either of transistors M1 and M2 do not unintentionally reactivate after being deactivated.

Figure 2:
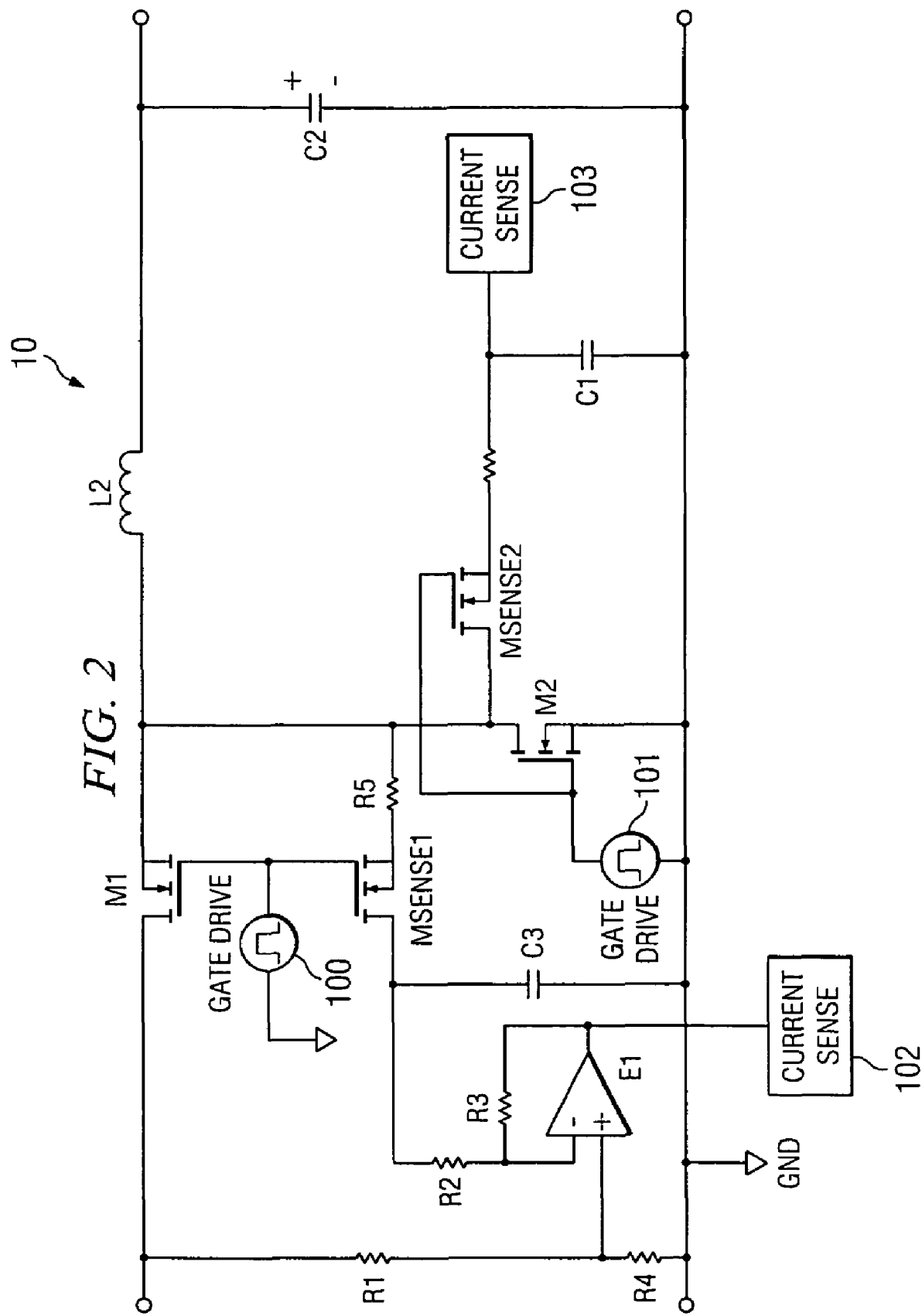
FIG. 2 is a circuit schematic illustrating one embodiment of the transistor monitor described herein.

FIG. 2 is a circuit schematic illustrating one embodiment of the transistor monitor described herein. A sensor for detecting current changes or the voltage drop across M1 is implemented using a small signal MOSFET, $M_{sense1}$, capacitor, C3, and differential amplifier, E1. When M1 is on, $M_{sense1}$ is also on. The current running through $M_{sense1}$ charges C3 which causes E1 to develop a differential voltage. The differential voltage at E1 provides a level shifting voltage with respect to ground, which is communicated to current sense 102. When implemented as a store and hold circuit, current sense 102 passes the current differential voltage from E1 with the previously measured differential voltage to difference detector 104 (FIG. 1). Difference detector 104 then determines whether a significant change in the voltage has occurred. If so, difference detector 104 triggers gate drives 100 and 101 to disable M1 and M2 to prevent catastrophic failure.

In similar operation, the voltage drop across M2 is monitored through $M_{sense2}$. When M2 is on, $M_{sense2}$ is also on. The current flowing through $M_{sense2}$ charges C1 which communicates its voltage level to current sense 103. As a sample and hold circuit, current sense 103 sends the current measurement as well as the held measurement to difference detector 104 to determine whether a significant change has occurred in the voltage drop across M2. If such a difference is detected, M1 and M2 are shut down by gate drives 100 and 101. Therefore, by sensing the changes in the voltage drop and corresponding current flow through M1 and M2, changes that may indicate an imminent failure are detected with the ability to shut down M1 and M2 before failure.

Figure 3:
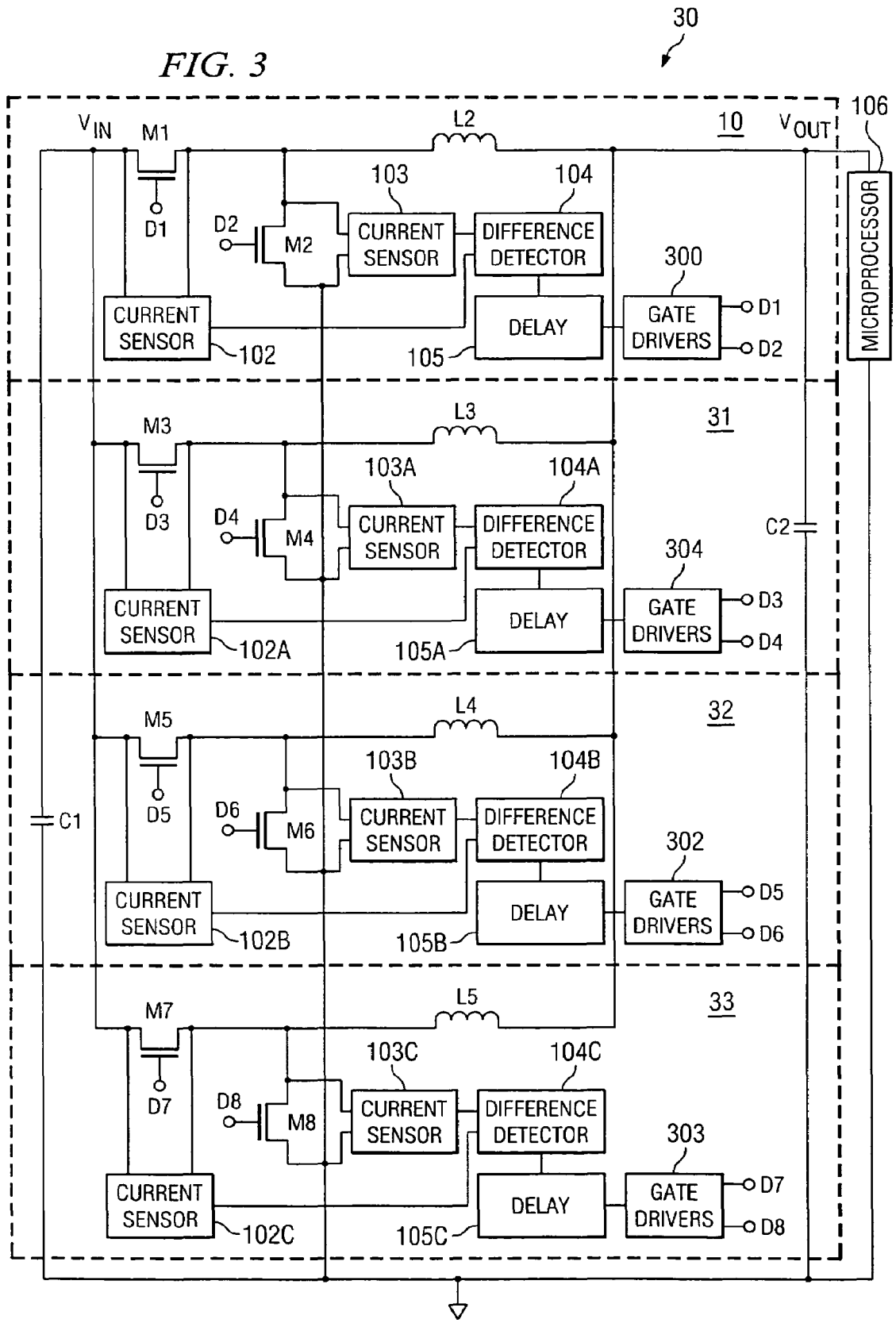
FIG. 3 is a block diagram illustrating a multiphase VRM configured according to an embodiment of the transistor monitor described herein.

FIG. 3 is a block diagram illustrating multiphase VRM 30 configured according to an embodiment of the transistor monitor described herein. Multiphase VRM 30 presents four single-phase sections, including single phase section 10, and single phase sections 31–33. Multiphase VRM 30 powers load microprocessor 106. Multiphase VRM 30 incorporates MOSFETs, M1–M8, inductors, L2–L5, and input and output capacitors, C1 and C2. The transistor monitor portions of multiphase VRM 30 include current sensors 102, 103, 102A–C, and 103A–C, difference detectors 104 and 104A–C, and delays 105 and 105A–C. Current sensors 102 and 103 measure the voltage drop/current across M1 and M2, as described with respect to FIG. 1. The sensed voltage drop is then communicated to difference detector 104 to determine whether either of M1 or M2 are close to failure. Similarly, the voltage drops across each of M3–M8 are measured by current sensors 102A–C and 103A–C, respectively. These sensed voltages are sent to different detectors 104A–C to determine whether any of M3–M8 are close to failure. Depending on the results of these determinations, signals are sent to gate driver circuits 300–303, which are a collection of gate drivers for supplying the requisite power at gates D1–D8. If a possible failure is detected in any one or more of M1–M8, a signal is directed to the corresponding ones of gate drivers 300–303 to turn off any of the pairs of transistors, M1–M2, M3–M4, M5–M6, and M7–M8 that include the transistors which are close to failure, thus preventing catastrophic failure of the entire multiphase VRM 30.

What is claimed is:

1. A monitor for deactivating a single phase section of a multiphase circuit comprising:
    a sensor connected to a transistor of said single phase section of said multiphase circuit for measuring a voltage drop across said transistor;
    a difference detector for comparing said voltage drop to a previous voltage drop attributable to said transistor; and
    a driver circuit for controlling a state of said transistor, wherein said driver circuit deactivates said transistor when said voltage drop varies from said previous voltage drop by a predefined amount.

2. The monitor of claim 1 further comprising:
    a memory for storing said measured voltage drop to become said previous voltage drop.

3. The monitor of claim 1 further comprising:
    a delay circuit for delaying said comparing by said difference detector to avoid output load transients.

4. The monitor of claim 1 wherein said sensor is implemented using a sample-and-hold circuit.

5. The monitor of claim 1, further comprising:
    another sensor connected to another transistor of said single phase section of said multiphase circuit for measuring another voltage drop across said another transistor;
    another difference detector for comparing said another voltage drop to another previous voltage drop attributable to said another transistor; and
    another driver circuit for controlling another state of said another transistor, wherein said another driver circuit deactivates said another transistor when said another voltage drop varies from said another previous voltage drop by another predefined amount.

6. The monitor of claim 5 wherein said another driver circuit deactivates said another transistor upon deactivation of said transistor, thereby deactivating said single phase section of said multiphase circuit.

7. The monitor of claim 1 further comprising:
    a latch circuit for latching said deactivated transistor to a deactivated state.

8. A method for monitoring performance of a plurality of transistors in a multiphase circuit comprising:
    measuring a voltage across said plurality of transistors;
    comparing said measured voltage against a prior measurement of said voltage; and
    deactivating one or more of said plurality of transistors when said measured voltage exceeds said prior measurement by a predetermined amount.

9. The method of claim 8 further comprising:
    storing said measured voltages for comparison against new measured voltages.

10. The method of claim 8 further comprising:
    delaying said comparing step to allow output load transients to attenuate prior to said comparing.

11. The method of claim 8 further comprising:
    deactivating ones of said plurality of transistors that are associated with said deactivated one or more of said plurality of transistors in a phase of said multiphase circuit.

12. The method of claim 8 further comprising:
    latching said deactivated one or more transistors in a deactivated state.

13. A system for monitoring a status of a plurality of transistors in a multiphase circuit comprising:
    means for evaluating a voltage drop across said plurality of transistors;
    means for comparing said measured voltage drop against a previously evaluated voltage drop; and
    means for turning off one or more of said plurality of transistors when said measured voltage drop varies from said previously evaluated voltage drop by predefined value.

14. The system of claim 13 further comprising:
means for holding said evaluated voltage drop for comparison against new evaluated voltage drops.

15. The system of claim 13 further comprising:
means for suspending said means for comparing to allow output load transients to attenuate.

16. The system of claim 13 further comprising:
means for turning off ones of said plurality of transistors that are associated with said turned off one or more of said plurality of transistors in a phase of said multiphase circuit.

* * * * *